United States Patent
Marques

(10) Patent No.: US 10,367,462 B2
(45) Date of Patent: Jul. 30, 2019

(54) CRYSTAL AMPLIFIER WITH ADDITIONAL HIGH GAIN AMPLIFIER CORE TO OPTIMIZE STARTUP OPERATION

(71) Applicant: SILICON LABORATORIES INC., Austin, TX (US)

(72) Inventor: Tiago Marques, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 98 days.

(21) Appl. No.: 15/639,038

(22) Filed: Jun. 30, 2017

(65) Prior Publication Data

US 2019/0007012 A1 Jan. 3, 2019

(51) Int. Cl.
| | |
|---|---|
| H03B 5/06 | (2006.01) |
| H03B 5/36 | (2006.01) |
| H03L 3/00 | (2006.01) |
| H03L 5/02 | (2006.01) |
| H03F 3/45 | (2006.01) |
| H03F 3/16 | (2006.01) |
| H01L 27/07 | (2006.01) |
| H03F 3/193 | (2006.01) |

(52) U.S. Cl.
CPC ..... *H03F 3/45179* (2013.01); *H01L 27/0727* (2013.01); *H03B 5/06* (2013.01); *H03B 5/364* (2013.01); *H03F 3/16* (2013.01); *H03F 3/193* (2013.01); *H03L 3/00* (2013.01); *H03L 5/02* (2013.01); *H03B 2200/0094* (2013.01)

(58) Field of Classification Search
CPC ... H03B 5/06; H03B 5/32; H03B 5/36; H03B 5/364; H03B 2200/0094; H03L 3/00; H03L 5/00; H03L 5/02

USPC .............. 331/116 FE, 116 R, 154, 158, 160, 331/172–174, 182, 183
See application file for complete search history.

(56) References Cited

U.S. PATENT DOCUMENTS

| | | | | |
|---|---|---|---|---|
| 4,321,562 A | * | 3/1982 | Igarashi | H03B 5/364 |
| | | | | 331/116 FE |
| 4,896,122 A | * | 1/1990 | Tahernia | H03B 5/32 |
| | | | | 331/116 FE |
| 4,956,618 A | * | 9/1990 | Ulmer | H03B 5/364 |
| | | | | 331/108 A |
| 5,041,802 A | * | 8/1991 | Wei | H03K 3/014 |
| | | | | 331/116 FE |

(Continued)

OTHER PUBLICATIONS

Stephens, Ransom. "The Future of Multi-Clock Systems." Frequency Controls, Inc. 2007 pp. 1-14.

*Primary Examiner* — Levi Gannon
(74) *Attorney, Agent, or Firm* — Gary Stanford

(57) ABSTRACT

A crystal amplifier for driving a crystal to oscillate at a resonant frequency including a controlled current source, a primary amplifier core, a high gain amplifier core, and a controller. Both amplifier cores are coupled in parallel, and each has an input coupled to an amplifier input node and an output coupled to an amplifier output node coupled across the crystal. The current source provides a core bias current to the source node. The controller enables the high gain amplifier core and sets the core bias current to a high current level to achieve a high negative resistance at a startup time, and then disables the high gain amplifier core and sets the core bias current to a lower steady state current level after oscillation is achieved. A level detector may be used for detecting oscillation and for determining when to adjust the core bias current.

16 Claims, 6 Drawing Sheets

(56) References Cited

U.S. PATENT DOCUMENTS

| | | | |
|---|---|---|---|
| 5,208,558 A * | 5/1993 | Shigehara | H03K 3/0307 331/116 FE |
| 5,416,445 A | 5/1995 | Narahara | |
| 5,453,719 A | 9/1995 | Narahara | |
| 5,900,787 A | 5/1999 | Yoshimura | |
| 5,912,594 A | 6/1999 | Burkhard | |
| 6,094,105 A | 7/2000 | Williamson | |
| 6,097,257 A * | 8/2000 | Kadowaki | G04F 5/06 331/116 FE |
| 6,133,801 A * | 10/2000 | Tanaka | H03B 5/32 331/116 R |
| 6,653,908 B1 | 11/2003 | Jones | |
| 6,696,899 B2 | 2/2004 | Ruffieux | |
| 6,782,485 B2 | 8/2004 | Takai | |
| 7,034,628 B1 | 4/2006 | Lu et al. | |
| 7,348,861 B1 * | 3/2008 | Wu | H03B 5/366 331/158 |
| 7,808,334 B2 * | 10/2010 | Yoshida | G01F 1/8431 310/329 |
| 7,868,710 B1 | 1/2011 | Farahvaash et al. | |
| 7,961,060 B1 | 6/2011 | McMenamy et al. | |
| 8,324,978 B2 | 12/2012 | Loeda | |
| 8,395,456 B2 | 3/2013 | Badillo et al. | |
| 9,614,509 B1 | 4/2017 | Ahmed | |
| 2004/0169562 A1 * | 9/2004 | Novac | H03B 5/06 331/158 |
| 2005/0017812 A1 | 1/2005 | Ashida et al. | |
| 2008/0211592 A1 | 9/2008 | Gaussen | |
| 2009/0002087 A1 * | 1/2009 | Toffolon | H03L 3/00 331/186 |
| 2009/0096541 A1 | 4/2009 | Tran | |
| 2009/0121799 A1 | 5/2009 | Ishikawa | |
| 2011/0037527 A1 * | 2/2011 | Shrivastava | H03B 5/06 331/158 |
| 2011/0291767 A1 * | 12/2011 | Ishikawa | H03K 3/0307 331/154 |
| 2012/0242418 A1 | 9/2012 | Takahashi | |
| 2013/0154754 A1 | 6/2013 | Frank | |
| 2014/0035689 A1 | 2/2014 | Ozawa et al. | |
| 2014/0091872 A1 | 4/2014 | Itasaka | |
| 2014/0320223 A1 | 10/2014 | Ozawa et al. | |
| 2016/0072438 A1 | 3/2016 | Fukahori | |
| 2019/0006990 A1 | 1/2019 | Marques et al. | |
| 2019/0006991 A1 | 1/2019 | Marques et al. | |
| 2019/0006992 A1 | 1/2019 | Marques | |
| 2019/0007005 A1 | 1/2019 | Marques | |

\* cited by examiner

CRYSTAL AMPLIFIER WITH ADDITIONAL HIGH GAIN AMPLIFIER CORE TO OPTIMIZE STARTUP OPERATION

CROSS REFERENCE TO RELATED APPLICATION(S)

This application is related to the following U.S. Patent Applications which are filed concurrently herewith and which are hereby incorporated by reference in their entireties for all intents and purposes.

| SERIAL NUMBER | FILING DATE | TITLE |
| --- | --- | --- |
| 15/639,137 | Jun. 30, 2017 | CRYSTAL AMPLIFIER WITH RESISTIVE DEGENERATION |
| 15/639,267 | Jun. 30, 2017 | CRYSTAL DRIVER CIRCUIT WITH CORE AMPLIFIER HAVING UNBALANCED TUNE CAPACITORS |
| 15/645,684 | Jul. 10, 2017 | CRYSTAL DRIVER CIRCUIT CONFIGURABLE FOR DAISY CHAINING |
| 15/724,714 | Oct. 4, 2017 | CRYSTAL DRIVER CIRCUIT WITH EXTERNAL OSCILLATION SIGNAL AMPLITUDE CONTROL |

BACKGROUND OF THE INVENTION

Field of the Invention

The present invention relates in general to crystal oscillators, and more particularly, to a crystal oscillator with a crystal amplifier including an amplifier core with an additional high gain amplifier core that is enabled during startup to reduce an amount of current used to achieve a higher startup negative resistance.

Description of the Related Art

A crystal oscillator uses the mechanical resonance of a crystal to create an electrical sinusoidal signal having a precise frequency. The crystal oscillator includes a crystal amplifier providing a "negative" resistance that cancels losses of the crystal to establish and maintain oscillation. In certain configurations, the crystal amplifier may include an N-channel MOS (NMOS) or a complementary MOS (CMOS) amplifier having an input and output for coupling across the crystal. The crystal may be modeled as a series combination of a motional capacitance, inductance, and resistance, and the crystal amplifier may be modeled as a negative resistance. The negative resistance of the crystal amplifier is designed to cancel losses of the crystal to establish and maintain oscillation.

At startup, the motional resistance RM of a "sleepy" crystal can be significantly higher than the steady state RM of the crystal. The gain and negative resistance of the crystal amplifier should initially be increased by a substantial factor to overcome any increased motional resistance of the crystal and also to reduce startup time. The resistance increase may be a particular factor of RM (e.g., 5×RM or 9×RM or the like), in which the selected factor may depend upon the particular crystal. Once oscillation is initiated, the gain and negative resistance of the amplifier is reduced to a steady state level to establish unity gain. One method of increasing the startup gain of the amplifier is to increase the current driving the main amplifier core. Achieving the needed negative resistance by increasing current alone, however, is inefficient, consumes a significant amount of power, and may be limited by specific circuit boundaries such as maximum allowable headroom and the like. Achieving device sizing that allows a good trade-off between startup and steady-state operation inevitably results in design compromise for both modes of operation, thus compromising optimal design for steady state operation.

The startup power consumption may be inconsequential for certain applications in which startup is infrequent, such as television (TV) applications or the like. When used for bursty radio communication applications, however, such as WiFi, Bluetooth, Zigbee, etc., startup operations occur very frequently, as the crystal oscillator can be powered down when not in use, so that startup power consumption and efficiency become significant factors.

SUMMARY OF THE INVENTION

A crystal amplifier for driving a crystal to oscillate at a resonant frequency according to one embodiment includes a controlled current source, a primary amplifier core, a high gain amplifier core, and a controller. Both amplifier cores are coupled in parallel between source and reference nodes, and each has an input coupled to an amplifier input node and an output coupled to an amplifier output node for coupling across the crystal. The high gain amplifier core further has an enable input. The current source provides a core bias current to the source node. The controller sets the core bias current to a high current level to achieve a high negative resistance at a startup time, and after oscillation is achieved, the controller sets the core bias current to a lower steady state current level and disables the high gain amplifier core.

Oscillation may be determined to be achieved after a predetermined time period based on crystal type and specification. A level detector may be included for monitoring either one of the amplifier input node or the amplifier output node, and may be used for determining oscillation when a threshold is reached. The steady state current level may be predetermined or otherwise known. If not known, the controller may use the level detector to perform automatic gain control by adjusting a current provided by the current source to determine the steady state current level. The level detector may be implemented as a peak detector or the like. The high gain amplifier core may be enabled for the startup process, and then disabled during the steady state mode.

In one embodiment, the level detector initially selects a first threshold value at the startup time, and after the level indication is provided indicating the first threshold value, the level detector may be switched to a second threshold value. When the level indication is first provided, the controller may set the core bias current to an intermediate current level (between the high current level and the steady state current level). When the level indication is provided indicating that the second threshold value has been reached, the controller may then set the core bias current to the steady state current level. A select circuit may be provided for selecting between the amplifier input and output nodes for level detection. For example, the amplifier output node may initially be selected for the first threshold, and the amplifier input node may then be selected for the second threshold.

Adjustable capacitors may be coupled to each of the amplifier input and output nodes. The controller may reduce the capacitances of the capacitors at startup, and may then increase the capacitances to steady state values when the either the first or the second threshold is met and/or when oscillation is achieved. A shorting circuit may be coupled between the amplifier input and output nodes for shorting the bias resistor (or substantially reducing the bias resistance) when the high gain amplifier core is enabled and/or disabled (such as for settling DC voltage and/or reducing crystal voltage peaking).

The high gain amplifier core may include a first portion of a first conductivity type and a second portion of a second conductivity type. The first portion may have a current path coupled between the source node and the amplifier output node and a control input coupled to the amplifier input node. The second portion may have a current path coupled between the amplifier output node and the reference node and a control input coupled to the amplifier input node. Each portion of the high gain amplifier core may include a pair of cascoded transistors. The inner cascoded transistors coupled to the amplifier output may be lower threshold transistors while the outer transistors are standard or higher threshold transistors. A switch circuit may be included for selectively disabling the high gain amplifier core by decoupling the control inputs of the first and second portions from the amplifier input node, by coupling the control input of the first portion to the source node, and by coupling the control input of the second portion to the reference node.

A method of driving a crystal to oscillate at a resonant frequency according to one embodiment includes, at a startup time, enabling a high gain amplifier core coupled in parallel with a primary amplifier core for driving the crystal when coupled between an amplifier input and an amplifier output, and asserting a core bias current provided to the primary amplifier core and to the high gain amplifier core at a high level. The method further includes determining when oscillation is achieved, and after oscillation is achieved, reducing the core bias current to a steady state level that is lower than the high level, and disabling the high gain amplifier core.

Determining when oscillation is achieved may be implemented using a timer or the like for determining expiration of a predetermined time period after the startup time. Alternatively, the method may include monitoring the voltage of either the amplifier input or the amplifier output, and determining when the monitored voltage reaches a threshold.

The method may include disabling the high gain amplifier core and reducing the core bias current to an intermediate level that is less than the high level and greater than the steady state level after determining when oscillation is achieved, monitoring the voltage of the amplifier input, and reducing the core bias current to the steady state level when the voltage of the amplifier input reaches a threshold.

The method may include adjusting capacitances at the amplifier input and the amplifier output to low values at the startup time, and after determining when oscillation is achieved, adjusting the capacitances at the amplifier input and the amplifier output to steady state values and momentarily reducing a bias resistance between the amplifier input and the amplifier output.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
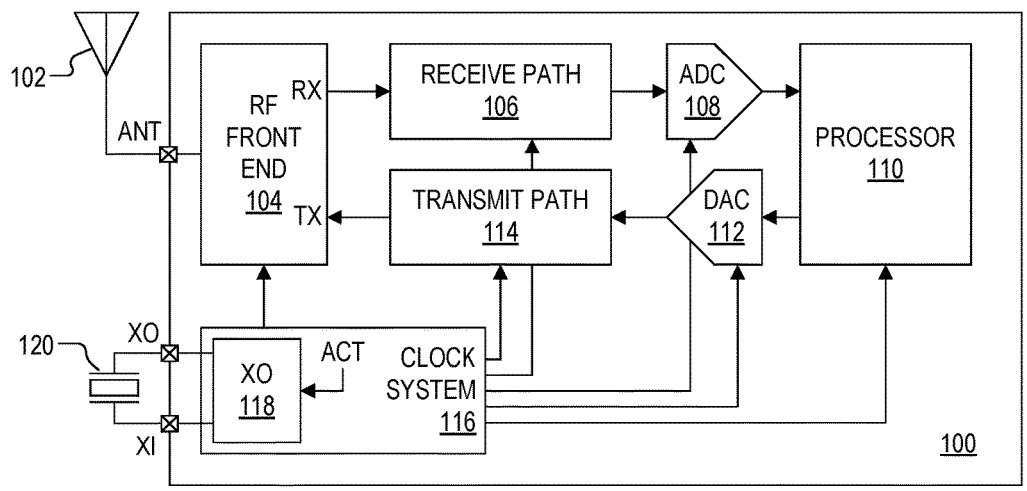
FIG. 1 is a simplified block diagram of a transceiver including a crystal oscillator (XO) system implemented according to one embodiment of the present invention.

The inventor has recognized the need to optimize the design of the primary amplifier core of a crystal oscillator for steady state operation. The inventor has also recognized the need to optimize startup performance of the crystal oscillator particularly for applications in which startup operation occurs on a regular basis. During startup operation, the negative resistance developed by the crystal amplifier should initially be increased to minimize the startup time t0 achieve steady state operation. Conventional configurations tend to be inefficient in terms of increased circuit size and/or power consumption and/or startup time before steady state operation is achieved.

The inventor has therefore developed a crystal amplifier with a primary amplifier core and an additional high gain amplifier core that optimizes startup operation. At startup, a core bias current is increased to a high level, in which the addition of the high gain amplifier core substantially increases amplifier gain. The increase of the core bias current is substantially less than that which would otherwise be needed to achieve a target level of negative resistance and gain if only the primary amplifier core was provided. The high gain amplifier core may be separately enabled; if so, it is enabled upon startup and disabled after oscillation is achieved. Several methods may be used to determine oscillation. In a simpler configuration, the amount of time that is needed to achieve oscillation is empirically determined, and a timer or the like is set to a time period of time in which oscillation is ensured. The timer or time period may be programmable for different crystals. Once oscillation is achieved, the core bias current is reduced to a steady state level. The steady state current level may also be empirically determined.

In an alternative configuration, a level detector, such as a peak detector or the like, is used to monitor either one of the amplifier input or output nodes compared to a predetermined threshold for determining when oscillation has been initiated. The difference between the amplifier input and output nodes is a matter of magnitude, and the threshold is set accordingly. The use of a level detector enables the steady state current level to be determined by performing automatic gain control (AGC). After oscillation is determined to be achieved, AGC is performed by adjusting the core bias current until the amplifier signal (input or output) achieves a predetermined target magnitude (set by a predetermined threshold). In one embodiment, AGC may be performed for each startup. Alternatively, a digital value or the like that corresponds with the steady state current level may be determined in a first startup iteration and stored, which may then be recalled for subsequent startup operations.

Although the level detector may monitor only one of the amplifier nodes, such as the amplifier input node, a select circuit may be included to enable the level detector to monitor either node. In one embodiment, the level detector initially monitors the amplifier output node, and when a first predetermined threshold is achieved, the high gain amplifier core is disabled, the core bias current is reduced to an intermediate level, and the level detector is switched to monitor the amplifier input node until it reaches a second predetermined threshold. Once the second threshold is achieved, the core bias current is adjusted further to the steady state level. Additional optimizing functions may be included, such as adjusting regulator voltage to maximize headroom, adjusting tuning capacitors to reduce startup time, and momentary shorting of the amplifier input node to the amplifier output node when enabling/disabling the high gain amplifier core to settle DC (direct current) voltage and reduce crystal voltage peaking.

The addition of the high gain amplifier core enables the primary amplifier core to be optimized for steady state operation, such as for minimal noise and/or maximum power supply rejection (PSR) and reverse PSR. The design of the high gain amplifier core is not limited to steady state operation and may thus be designed to optimize startup operation.

FIG. 1 is a simplified block diagram of a transceiver 100 including a crystal oscillator (XO) system 118 implemented according to one embodiment of the present invention. The illustrated transceiver 100 is shown in generalized form for any of various wireless communication applications, such as Bluetooth®, Zigbee, Wi-Fi, etc. Other functional circuit blocks and circuits may be included for particular applications, but are not shown as not necessary for a full and complete understanding of the present invention. The transceiver 100 may be implemented on an integrated circuit (IC) or semiconductor chip or the like, which may be mounted on a printed circuit board (PCB) (not shown), a module (not shown), or the like as part of an electronic system. It is noted that the XO system 118 may be integrated on a separate IC or semiconductor chip or the like either alone or as part of a separate clock system (e.g., shown as a clock system 116).

The electronic system incorporating the transceiver 100 is any one of various configurations, such as a communication device (hand-held, mobile, stationary, etc.), a computer system (laptop, desktop, server system, etc.), a computer peripheral device (e.g., printer, router, etc.), or any other devices that may be networked together via wired and/or wireless communications. The present disclosure contemplates the use of the transceiver 100 incorporated within a device that may be part of a suite of components of an Internet of Things (IoT) platform or the like. The components or devices may be powered from an external source (e.g., AC outlet or the like), or may be battery-operated. Although the present invention is illustrated within a wireless communication system, it is understood that the present invention is not limited to wireless communications and may be used in any application that uses a crystal oscillator.

The transceiver 100 includes a radio frequency (RF) front end 104 coupled to an antenna 102 via an antenna pin ANT (or other appropriate antenna interface) for receiving and transmitting RF signals. The RF front end 104 has a receive (RX) output coupled to the input of a receive path 106, which processes received signals and which provides a processed analog baseband signal at its output for conversion to digital format by an analog to digital converter (ADC) 108. The ADC 108 provides digital baseband signals to a processor 110, which further processes the digital baseband signals according to the particular application. The processor 110 also encapsulates and provides digital baseband signals for transmission, which are converted to analog format by a digital to analog converter (DAC) 112, which has an output provided to an input of a transmit path 114. The output of the transmit path 114 is provided to a transmit (TX) input of the RF front end 104, which ultimately transmits the information via the antenna 102.

The particular details of each of the functional blocks are beyond the scope of the present disclosure. In one embodiment, for example, the RF front end 104 may include one or more mixers that downconvert received RF signals to an intermediate frequency (IF), or that directly convert received RF signals to baseband signals, which are further processed by the receive path 106. In an IF configuration, the receive path 106 further includes one or more mixers or the like for downconverting IF signals to the baseband signals. In either case, the receive path 106 further includes amplifiers (e.g., programmable gain amplifiers or PGAs), filters (e.g., low-pass filters or LPFs), peak detectors, and other supporting circuitry for isolating and processing the baseband signals for digital conversion for further processing by the processor 110. The transmit path 114 includes similar functions for processing an analog baseband signal from the DAC 112 for transmission by the RF front and 104 to external devices or components.

The transceiver 100 further includes the clock system 116 incorporating the XO system 118 which is coupled to an external crystal 120 via an amplifier output pin XO and an amplifier input pin XI. The clock system 116 generally develops one or more clock signals for use by the various functional blocks of the transceiver 100. The present disclosure primarily concerns the XO system 118 including a crystal amplifier for driving the crystal 120 to develop an oscillation signal used for developing one or more clock signals. Although not shown, the clock system 116 may include additional crystal amplifiers, including high frequency and/or low frequency variations, along with one or more resistor-capacitor (RC) oscillators and the like. In one embodiment, the XO system 118 is maintained in a power-down or standby mode when not being used. In the illustrated configuration, the transceiver 100 and/or the clock system 116 provides an activation signal ACT which is asserted to activate or enable the XO system 118 and negated to place the XO system 118 into the standby mode.

Figure 2:
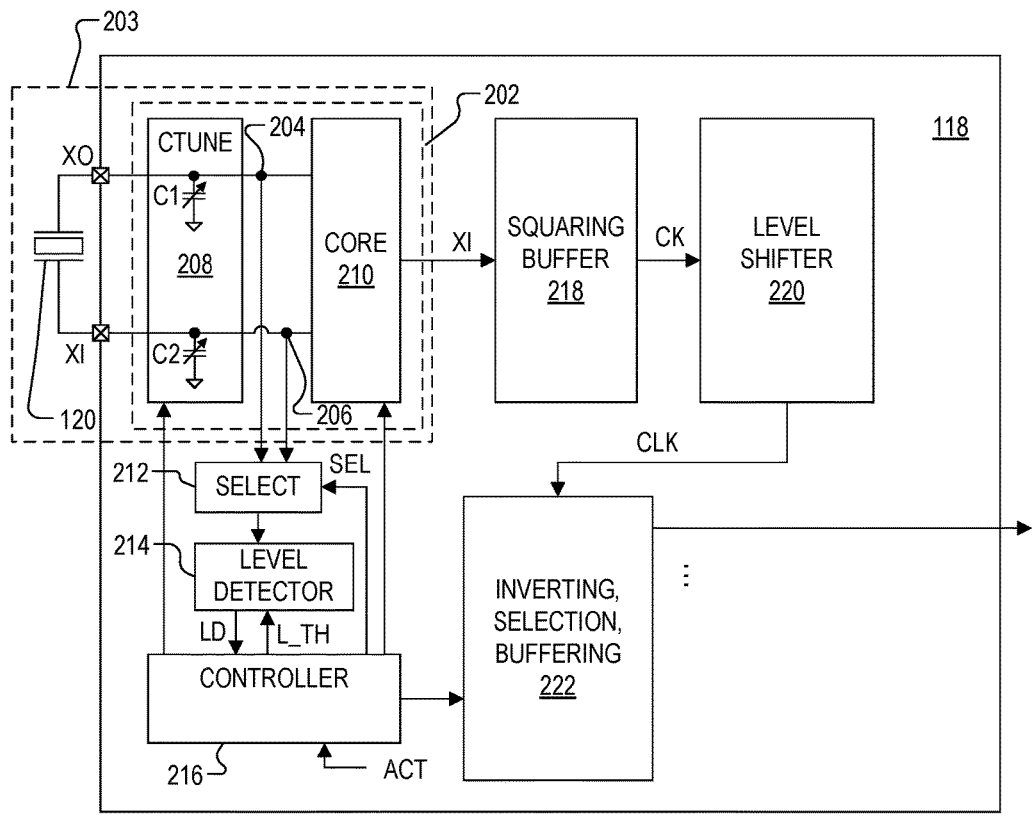
FIG. 2 is a simplified block diagram of the XO system of FIG. 1 incorporating a single crystal amplifier and supporting functional blocks.

FIG. 2 is a simplified block diagram of the XO system 118 incorporating a single crystal amplifier 202 and supporting circuitry. The crystal 120 is coupled between the XO and XI pins of the transceiver 100, in which XO is internally coupled an amplifier output node 204 and XI is internally coupled to an amplifier input node 206. As used herein, "XO" generally refers to the XO pin and/or the amplifier output node 204 and "XI" generally refers to the XI pin and/or the amplifier input node 206. It is noted that the combination of the crystal amplifier 202 and the crystal 120 is referred to as a crystal oscillator 203. The crystal amplifier 202 includes a tuning capacitor (CTUNE) circuit 208 and an amplifier core 210, which are both coupled to the amplifier input and output nodes 204 and 206. The CTUNE circuit 208 includes a first adjustable capacitor C1 coupled between the amplifier output node 204 and a reference node and a second adjustable capacitor C2 coupled between the amplifier input node 206 and the reference node. The reference node develops a suitable positive, negative or zero voltage level, such as ground (GND).

The XO system 118 may further include a select circuit 212 having a first input coupled to the amplifier output node 204, a second input coupled to the amplifier input node 206, a control input receiving a select signal SEL, and an output that couples or forwards a selected input to an input of a level detector 214. The level detector 214 may be implemented as a peak detector, an amplitude detector, a signal level detector, such as for determining the root-mean-square (RMS) level of an input voltage level, etc. The level detector 214 receives a level threshold L_TH from a controller 216 and provides a level detect value LD to an input of the controller 216. It is noted that the level detector 214 may incorporate the select circuit 212 and receive SEL for selecting between XO or XI. In one embodiment, the level detector 214 asserts LD when a level of a selected one of the amplifier input and output nodes XI or XO reaches the level threshold provided by L_TH. The controller 216 receives the ACT signal for activating the XO system 118 and for returning the XO system 118 to the standby mode. The controller 216 has an adjust output to adjust the capacitance values of the first and second adjustable capacitors C1 and C2. The controller 216 provides SEL to the control input of the select circuit 212 for selecting between the amplifier input and output nodes 204 and 206 for level detection. The controller 216 also has at least one additional output for enabling various blocks and for controlling various parameters of the amplifier core 210 as further described herein.

The crystal amplifier 202 sustains oscillation of the crystal 120 by generating the appropriate level of negative resistance between XO and XI (coupled across the crystal 120) to develop an oscillating signal. The oscillating signal generally has a sinusoidal waveform, which is provided to an input of a squaring buffer 218. The squaring buffer 218 converts the oscillating signal on XI (or, alternatively, XO) to a squarewave clock signal CK, which is provided to an input of a level shifter 220. The level shifter 220 adjusts the voltage level of CK and provides a corresponding clock signal CLK to an input of an inverting, selection, and buffering circuit 222. The inverting, selection, and buffering circuit 222 incorporates multiple inverters, multiplexers (MUXes), and buffers or the like for providing multiple clock signals and inverted clock signals based on CLK. The inverting, selection, and buffering circuit 222 may also convert one or more clock signals or inverted clock signals from single-ended to differential format. The controller 216 has corresponding outputs for selecting between each clock signal or its inverted version. One or more of the selected clock signals may be provided directly to selected portions of the transceiver 100. One or more of the selected clock signals may also be provided to other circuitry (not shown) within the clock system 116 for further processing, such as clock synthesizers or the like (not shown), for providing one or more modified clock signals (e.g., changes of one or more of frequency, duty cycle, amplitude, etc.) for use by other portions of the transceiver 100. The particular clock signals or uses thereof are not further described herein.

Figure 3:
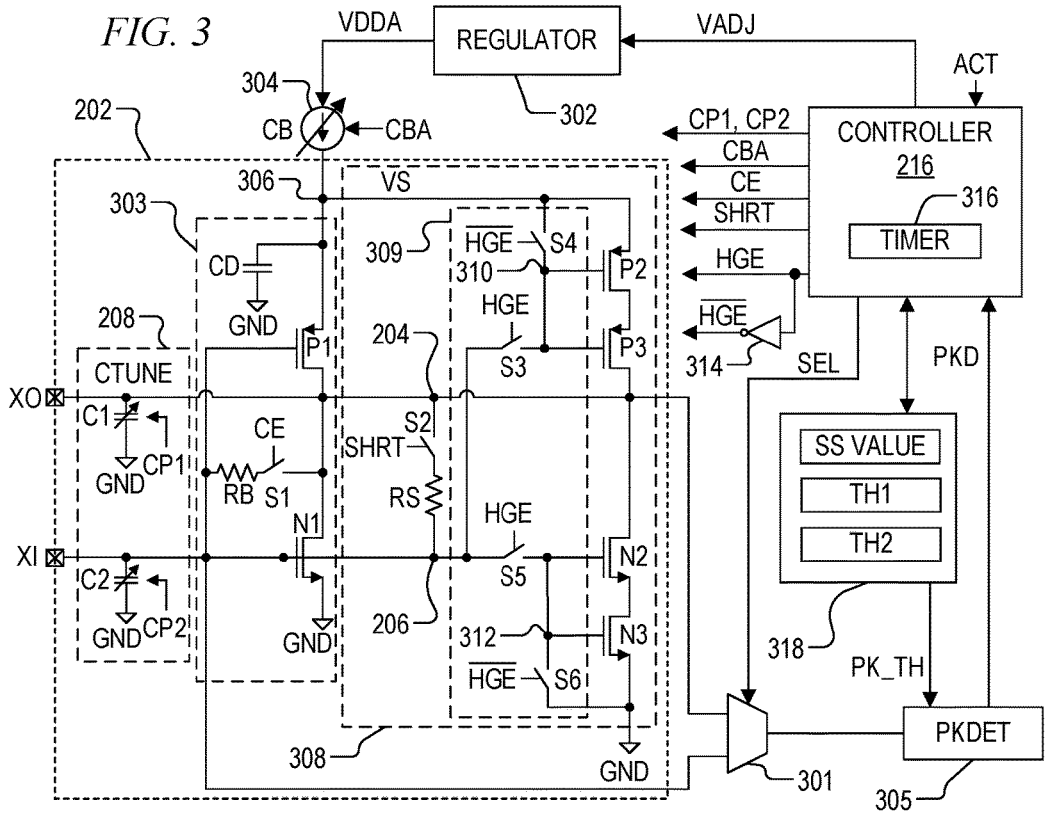
FIG. 3 is a schematic and block diagram of the crystal amplifier of FIG. 2 implemented according to one embodiment of the present invention and including additional supporting circuitry.

FIG. 3 is a schematic and block diagram of the crystal amplifier 202 implemented according to one embodiment of the present invention including the CTUNE circuit 208 and amplifier core 210, which is further coupled a multiplexer (MUX) 301 (implementing the select circuit 212), a peak detector (PKDET) 305 (implementing the level detector 214), the controller 216, and to an adjustable voltage regulator 302. The crystal amplifier 202 includes the CTUNE circuit 208, an adjustable current source 304, a primary amplifier core 303 and a high gain amplifier core 308. The MUX 301 has a control input receiving the SEL signal from the controller 216 for selecting between the amplifier input node 206 and the amplifier output node 204. The voltage regulator 302 develops an adjustable source voltage VDDA which is provided to an input terminal of the adjustable current source 304. The controller 216 provides an adjust signal VADJ to adjust the voltage level of VDDA as further described herein. The current source 304 provides a core bias (CB) current to a source node 306 developing a source voltage VS, and the controller 216 provides an adjust signal CBA to adjust the level of the core bias current as further described herein. It is noted that the current source 304 provides the core bias current to drive either or both the primary amplifier core 303 and the high gain amplifier core 308 further described herein.

Figure 8:
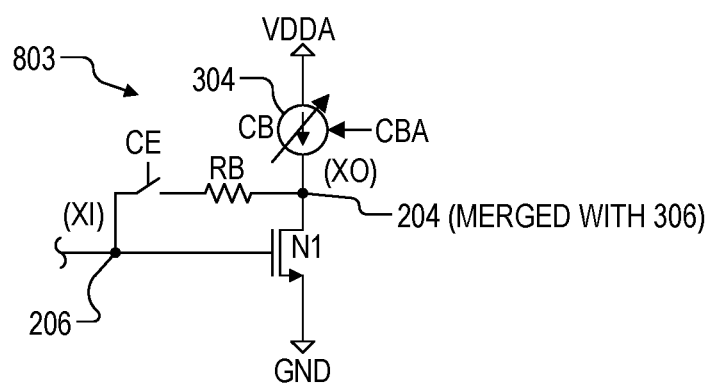
FIG. 8 is a schematic diagram of an alternative primary amplifier core that may replace the primary amplifier core of FIG. 3.

The primary amplifier core 303 includes a P-channel transistor P1, an N-channel transistor N1, a decoupling capacitor CD, a bias resistor RB, and an enable switch S1. Although shown as a CMOS primary core, the primary amplifier core may also be implemented as an NMOS core (as shown in FIG. 8). The source node 306 is coupled to a source terminal of P1 and to one terminal of the decoupling capacitor CD. The other terminal of the capacitor CD is coupled to the reference node (e.g., GND). A drain terminal of P1 is coupled to the amplifier output node 204, and a gate terminal of P1 is coupled to the amplifier input node 206. The amplifier output node 204 is further coupled to a drain terminal of N1, having its gate terminal coupled to the amplifier input node 206 and its source terminal coupled to GND. The bias resistor RB is coupled in series with the switch S1 between the amplifier output node 204 and the amplifier input node 206. S1 is shown configured as a single-pole, single-throw (SPST) having a control input receiving a core enable signal CE for enabling or disabling the primary amplifier core 303. Although not shown, an additional switch may be coupled between XO and GND controlled by CE for grounding XO when disabled. The tuning capacitors of the CTUNE circuit 208 are coupled in the same manner previously described.

Similar to the primary amplifier core 303, the high gain amplifier core 308 is coupled between the source node 306 and GND, and is further coupled to the amplifier output node 204 and the amplifier input node 206. The high gain amplifier core 308 includes P-channel transistors P2 and P3, N-channel transistors N2 and N3, a switch circuit 309, a shorting resistor RS and another SPST switch S2. P2 has its source terminal coupled to the source node 306, its drain terminal coupled to the source terminal of P3, and its gate terminal coupled to the gate terminal of P3 at a first enable node 310. The drain terminal of P3 is coupled to the amplifier output node 204. N2 has its drain terminal coupled to the amplifier output node 204, its source terminal coupled to the drain terminal of N3, and its gate terminal coupled to the gate terminal of N3 at a second enable node 312. The source terminal of N3 is coupled to GND. The resistor RS and the switch S2 are coupled in series between the amplifier input node 206 and the amplifier output node 204, and S2 has a control input receiving a short signal SHRT from the controller 216.

The switch circuit 309 includes a set of SPST switches S3, S4, S5 and S6. S3 selectively couples the enable node 310 to the amplifier input node 206 and S5 selectively couples the enable node 312 to the amplifier input node 206, each controlled by an enable signal HGE provided by the controller 216. HGE is provided to an input of an inverter 314, having its output providing in inverted enable signal $\overline{\text{HGE}}$. S4 selectively couples the enable node 310 to the source node 306 and S6 selectively couples the enable node 312 to GND, each controlled by $\overline{\text{HGE}}$. It is noted that S4 is coupled to the source node 306 for improved reliability and optimal PSR, although S4 may alternatively coupled to a power supply node or the like. When HGE is asserted high by the controller 216, the switches S3 and S5 are closed and the switches S4 and S6 are opened to enable the high gain amplifier core 308. When HGE is asserted low by the controller 216, the switches S3 and S5 are opened and the switches S4 and S6 are closed to disable the high gain amplifier core 308.

It is noted that each of the transistors described herein, including P1-P3 and N1-N4, are one of at least two different conductivity types, such as either N-type (e.g., N-channel) or P-type (e.g., P-channel). Each transistor includes two current terminals (e.g., drain and source terminals), and a control terminal (e.g., gate terminal). In the illustrated configuration, each transistor may be configured as a MOS transistor or a FET or the like, including any one of various configurations of MOSFETs and the like. For example, the N-type transistors may be NMOS transistors or NFETs, and the P-type transistors may be PMOS transistors or PFETs. In one embodiment, P2 is a P-type standard threshold voltage transistor (SVT) and N3 is an N-type SVT, and P3 is a P-type lower threshold voltage transistor (LVT) and N2 is an N-type LVT. P2 and P3 have their current terminals coupled in a cascode configuration between the source node 306 and the amplifier output node 204, and N2 and N3 have their current terminals coupled in a cascode configuration between the amplifier output node 204 and GND. In one embodiment, P2 is significantly larger than P3, and N3 is significantly larger than N2. In a more specific embodiment, P2 is about 3 times (3×) the size of P3, and N3 is about 3× the size of N2. The switches S1-S6 are shown in simplied form, in which each may be implemented by one or more transistors of a suitable conductivity type. Each cascode configuration, including P2 & P3 and N2 & N3, improves gain when enabled and provides additional isolation when disabled, and can also be made smaller to reduce capacitance at the output when disabled.

The controller 216 may be implemented as a digital state machine or the like in which adjustments of the crystal amplifier 202 are made by providing and updating changing digital code values to various components. Although the controller 216 is shown embodied within a single block within the XO system 118, control functions may be distributed at various locations within the XO system 118 and/or within the clock system 116 and/or the transceiver 100. One or more of the digital code values as described herein may be adjustable or otherwise programmable within a corresponding programmable memory or the like (not shown). VADJ may be a digital code value provided to the voltage regulator 302, which drives VDDA to a corresponding voltage level accordingly. Similarly, CBA may be another digital code value provided to the current source 304, which adjusts the core bias current provided to the source node 306 accordingly. Likewise, the controller 216 provides two separate digital code values, including CP1 for adjusting the capacitance of C1 and CP2 for adjusting the capacitance of C2. In one embodiment, the capacitors C1 and C2 may each be implemented as multiple capacitors and corresponding switches (not shown) in which the corresponding digital control values CP1 and CP2 control the switches to select a corresponding capacitance.

The controller 216 may include timing functions generally represented as a timer 316. The controller 216 may access a memory 318 for storing various programmable values or parameters that are predetermined or determined during operation. For example, the memory 318 may store a steady state (SS) value that is used retrieved and output as the CBA value to determine the steady state core bias current level provided by the current source 304. The memory 318 may store various threshold values, including a first threshold TH1 and a second threshold TH2, for access and use by the peak detector 305 as further described herein. The memory 318 is accessible by the controller 216 and may be provided within the XO circuit 118, or within the clock system 116 and accessibly by the XO circuit 118, or may be elsewhere in the transceiver 100. Although shown as part of the controller 216, the timer 316 may be provided externally and accessible by the controller 216.

In one embodiment, the peak detector 305 may be implemented as an envelope tracker (not shown), a simple comparator (not shown) and a digital-to-analog converter (DAC) or the like (not shown) that converts the selected input with a selected comparison threshold PK_TH from the memory 318. As described further herein, several thresholds may be defined (e.g., TH1, TH2, etc.), and each may be programmed into the memory 318 accessible by the peak detector 305 for setting its threshold for comparison. The peak detector 305 accesses and selects the applicable threshold provided as PK_TH, and the comparator compares the input with the selected threshold and asserts PKD as a digital output when the threshold is reached.

CE and SHRT are binary voltage values (e.g., asserted high or negated low) for opening and closing the switches S1 and S2, respectively. The controller 216 asserts CE high to close switch S1 to enable the primary amplifier core 303. The controller 216 asserts SHRT high to close switch S2 to effectively place RS in parallel with RB for "shorting" the amplifier output node 204 to the amplifier input node 206. RS has a significantly lower resistance than RB, so that when S2 is closed while S1 is also closed, the resistance between XI and XO is substantially reduced for adjusting the DC of XI. HGE and $\overline{\text{HGE}}$ are also binary voltage values each sufficient for turning on and off the switches S3-S6. Similarly SEL is a binary value for controlling the select circuit (or MUX) 212 for selecting either the amplifier input node 206 or the amplifier output node 204 to be conveyed to the input of the peak detector 305. The select circuit 212 may alternatively be implemented with one or more switches or the like.

Operation of the crystal amplifier 202 of the crystal oscillator 203 is now briefly described. The crystal amplifier 202 is initially placed into a standby mode and remains in standby while ACT is negated. When ACT is asserted to initiate startup, the voltage regulator 302 is initialized and the controller 216 adjusts the voltage level of VDDA. If disabled during standby, then the controller 216 enables the primary amplifier core 303 and the high gain amplifier core 308. The controller 216 sets CBA to a predetermined high value so that the current source 304 provides a high level of current. Most of the current from the current source 304 flows through the high gain amplifier core 308 (mostly because of the lower VT devices and/or sizing of the high gain amplifier core versus the primary amplifier core) sufficient to drive the negative resistance appearing between the amplifier input and output pins XO and XI, and thus to the crystal 120, to a relatively high level. Once oscillation is determined to be achieved, such as in response to a timeout of the timer 316 or when the peak detector asserts PKD, the controller 216 may disable the high gain amplifier core 308, and adjusts CBA to reduce the core bias current. If the SS value was previously stored in the memory 318, then the controller 216 eventually adjusts CBA to the SS value level so that the current source 304 outputs a steady state current level. The controller 216 may perform an AGC process to determine the SS value, which is then stored in the memory 318 for future use.

The controller 216 may take additional steps to further improve the startup process. For example, VDDA may be adjusted to a maximum level VH, the capacitor values of C1 and C2 may be adjusted to accelerate startup, the core bias current may be asserted to an intermediate level before being dropped to the steady state current level, the controller 216 may pulse SHRT to short XI to XO to allow the DC voltage of XI to settle when enabling or disabling the high gain amplifier core 308, etc. Once the current operation is completed, the controller 216 may perform a shutdown process to place the XO system 118 back into the standby mode. The controller 216 reduces the core bias current and VDDA to minimum levels.

Figure 4:
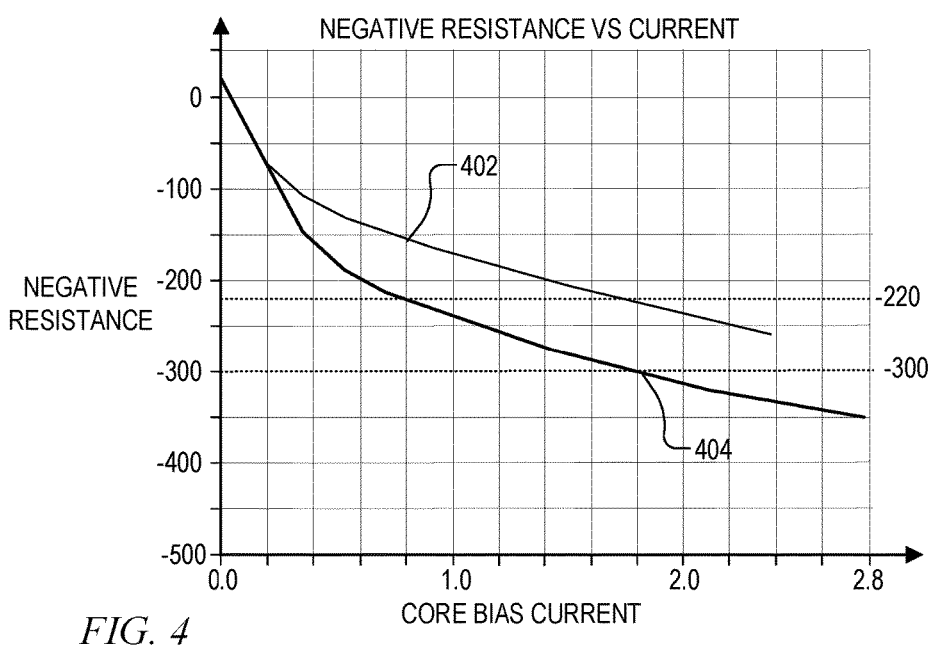
FIG. 4 is a graphic diagram that plots an exemplary range of negative resistances of the crystal amplifier of FIG. 1 versus exemplary core bias current for two cases of a specific configuration, including a first case in which only a primary amplifier core is enabled while a high gain amplifier core is disabled, and a second case in which both the primary amplifier core and the high gain amplifier core are enabled.

FIG. 4 is a graphic diagram that plots an exemplary range of negative resistances of the crystal amplifier 202 (e.g., in Ohms, Ω) versus exemplary core bias current (e.g., in milliamps, or mA) for two cases of a specific configuration, including a first case in which the primary amplifier core 303 is enabled and while the high gain amplifier core 308 is disabled (curve 402), and a second case in which both the primary amplifier core 303 and the high gain amplifier core 308 are both enabled (curve 404). In one specific embodiment, for example, it may be desired to drive the negative resistance to about −220Ω during startup. In this case, when the high gain amplifier core 308 is disabled as shown by the curve 402, the core bias current is almost 1.8 mA to achieve the negative resistance of −220Ω. When the high gain amplifier core 308 is enabled as shown by the curve 404, however, the current is less than 0.8 mA to achieve the same negative resistance of −220Ω during startup. In another embodiment it is desired to drive the negative resistance to −300Ω during startup. In this second case, if the high gain amplifier core 308 is disabled as shown by the curve 402, the primary amplifier core 303 may not be able, by itself, to achieve the desired negative resistance level. In particular, the primary amplifier core 303 by itself may not have sufficient headroom to achieve a current level of 2.4 mA or more even when VDDA is increased. When the high gain amplifier core 308 is enabled as shown by the curve 404, however, the core bias current is less than about 1.7 mA to achieve the target negative resistance of −300Ω, which is well within the maximum headroom of the circuit. The high gain amplifier core 308, therefore, enables a substantial reduction of the core bias current necessary to drive the negative resistance to the desired levels during startup as well as a reduction in the necessary headroom for proper operation over process, voltage and temperature (PVT).

During steady state operation after the startup process, both curves 402 and 404 converge at about 0.2 mA for a corresponding negative resistance of about −70Ω. Thus, the primary amplifier core 303 is sufficient, by itself, to achieve a steady state negative resistance of up to −70Ω. In one embodiment, the primary amplifier core 303 may be optimized for a 40Ω crystal (having an equivalent series resistance (ESR) of 40Ω). As shown in the graph diagram of FIG. 4, the primary amplifier core 303 drives a low current level between 0.1 mA-0.2 mA during steady state operation to achieve a negative resistance suitable for a 40Ω crystal. In this manner, the high gain amplifier core 308 provides optimal performance at startup to match the resistance of a "sleepy" crystal at startup, and the primary amplifier core 303 provides optimal performance during steady state operation. For applications in which startup occurs on a regular or frequent basis, such as bursty communications including wireless communications and the like, the addition of the high gain amplifier core 308 significantly reduces power consumption and substantially improves efficiency of the crystal oscillator 203 over time.

Figure 5:
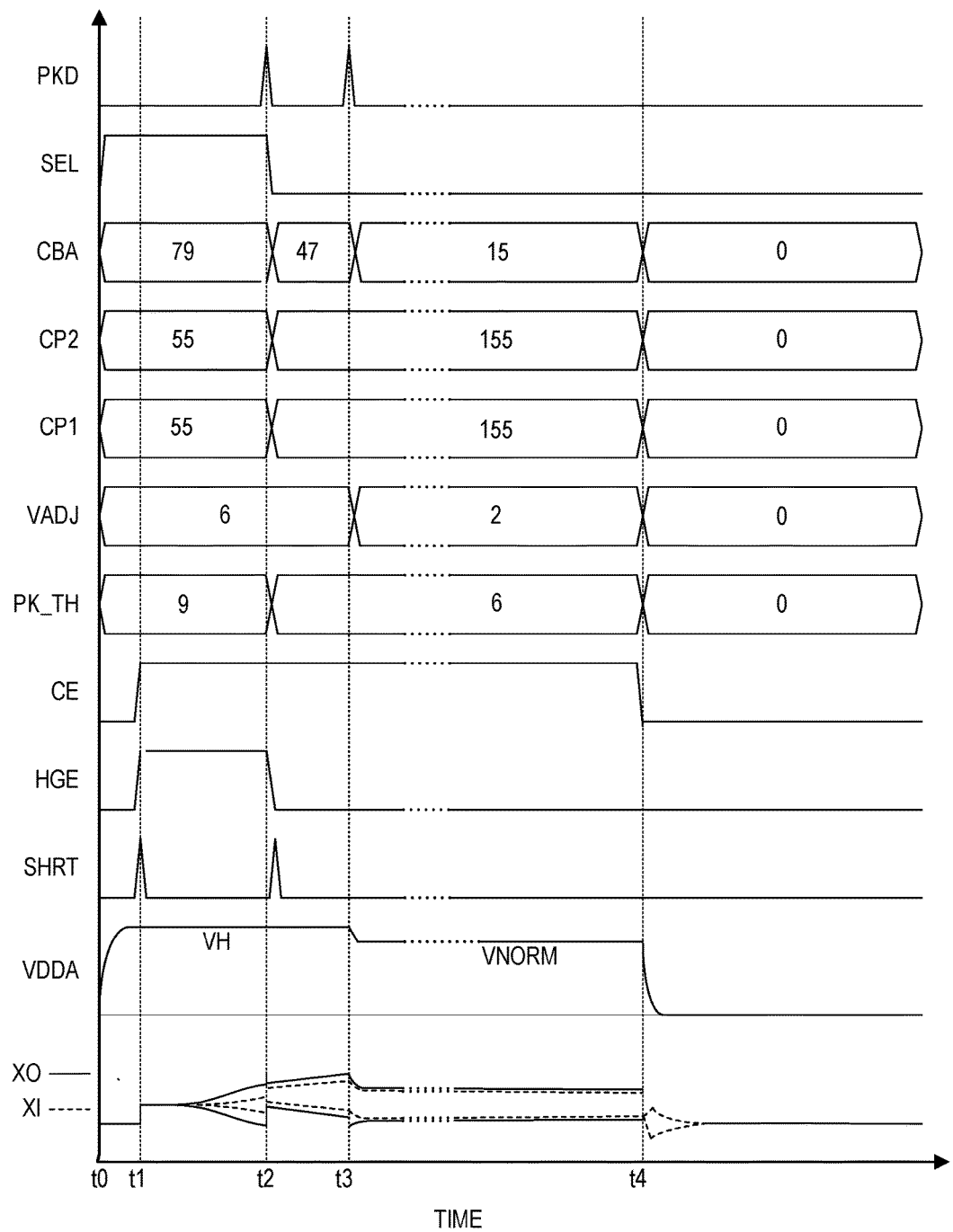
FIG. 5 is a graph diagram plotting representative signals of FIG. 3 versus time for startup, steady state and standby modes of operation.

FIG. 5 is a graph diagram plotting PKD, SEL, CBA, CP2, CP1, VADJ, PK_TH, CE, HGE, SHRT, VDDA, and XO/XI versus time for startup, steady state, and standby modes of operation according to one embodiment of the present invention. PKD, SEL, CE, HGE, and SHRT are binary values (asserted either low or high), CBA, CP2, CP1, VADJ and PK_TH are digital code values, while VDDA and XO/XI are analog voltage values. The envelop of XO is plotted using solid lines, while the envelop of XI is plotted with dashed lines. Various other enable values and digital code values may be asserted or adjusted, but are not shown.

At an initial time t0, the transceiver 100 or the clock system 116 asserts ACT to activate the XO system 118 from its standby mode to provide one or more clock signals, such as to send or receive a communication packet (not shown) or the like. The controller 216 asserts SEL high to select the amplifier output node 204 (or XO) to be monitored by the peak detector 305. The controller 216 asserts CBA, CP2, CP1, and VADJ, to initial digital code values 79, 55, 55, and 6, respectively, which are relative code values indicating the relative level of the corresponding signal. A CBA value of 79, for example, causes the current source 304 to drive a high current level for startup operation. As shown by curve 404 of FIG. 4, the digital code 79 may represent an initial startup core bias current of approximately 0.8 mA to achieve an initial negative resistance of −220Ω. CP2 and CP1 are initially set to a relatively low digital code of 55 each, which is less than the steady state capacitance to reduce the startup delay. It is noted that reducing the capacitance of the CTUNE capacitors reduces the level of negative resistance needed at startup. VADJ is set to a high digital code value of 6, and VDDA rises and stabilizes at the higher voltage level VH to provide maximum headroom during startup as compared to a lower normal source voltage level VNORM used or steady state operation. The peak detector 305 retrieves the first predetermined threshold TH1 via PK_TH for the amplifier output node 204 (or XO), which shown having a digital code value of 9.

Just after time t0, VDDA rises and stabilizes at VH. After VDDA stabilizes, the controller 216 asserts CE and HGE at time t1 to enable both the primary amplifier core 303 and the high gain amplifier core 308. In one embodiment, VDDA may be sensed providing a feedback signal to the controller 216 to determine when VDDA stabilizes at VH. In another embodiment, the controller 216 delays by a predetermined amount of time before enabling the amplifier cores. When CE and HE are both asserted high (to enable both amplifier cores), the controller 216 also pulses SHRT high to temporarily "short" XO to XI to allow the DC value at XI to settle to avoid XO transients. The high core bias current through the high gain amplifier core 308 establishes an appropriate startup negative resistance suitable for the particular crystal 120. Soon after time t1, the crystal 120 begins to oscillate as shown by the XO/XI signals, in which XO and XI both increase in magnitude.

XO reaches the first predetermined threshold TH1 and the peak detector 305 asserts a pulse on PKD at time t2. In response, the controller 216 negates HGE low to disable the high gain amplifier core 308 while the primary amplifier core 303 remains enabled, and the controller 216 also pulses SHRT high. The controller 216 further negates SEL low to switch the peak detector 305 to monitor XI, and the peak detector 305 retrieves the second predetermined threshold TH2 via PK_TH shown having a digital code value of 6. The controller 216 also adjusts CBA to a digital code value of 47 to reduce the core bias current provided by the current source 304 to an intermediate current level. The controller 216 also adjusts CP2 and CP1 to new digital code values of 155 each to increase the capacitance of C1 and C2 for steady state operation. VADJ remains unmodified so that VDDA remains at VH.

XI reaches the second predetermined threshold TH2 and the peak detector 305 asserts another pulse on PKD at time t3. In response, the controller 216 adjusts CBA to a digital code value of 15 to reduce the core bias current to low current level suitable for steady state. Also, the controller 216 adjusts VADJ to a code value 2 to reduce VDDA to the steady state normal level VNORM as shown. The startup process is completed just after time t3 and steady state operation occurs between times t3 and t4.

At about time t4, steady state operation is completed (such as indicated by ACT being negated low), and the controller 216 shuts down operation of the XO system 118 and places it back into the standby mode. This may be initiated by negation of ACT. As shown, the CBA, CP2, CP1, and VADJ are adjusted to standby values of 0 or the like. The controller 216 negates CE low to disable the primary amplifier core 303. VDDA goes back low towards zero and operation remains in the standby mode until re-enabled for a subsequent communication session, in which case the startup and steady state operations are repeated in a similar manner.

Figure 6:
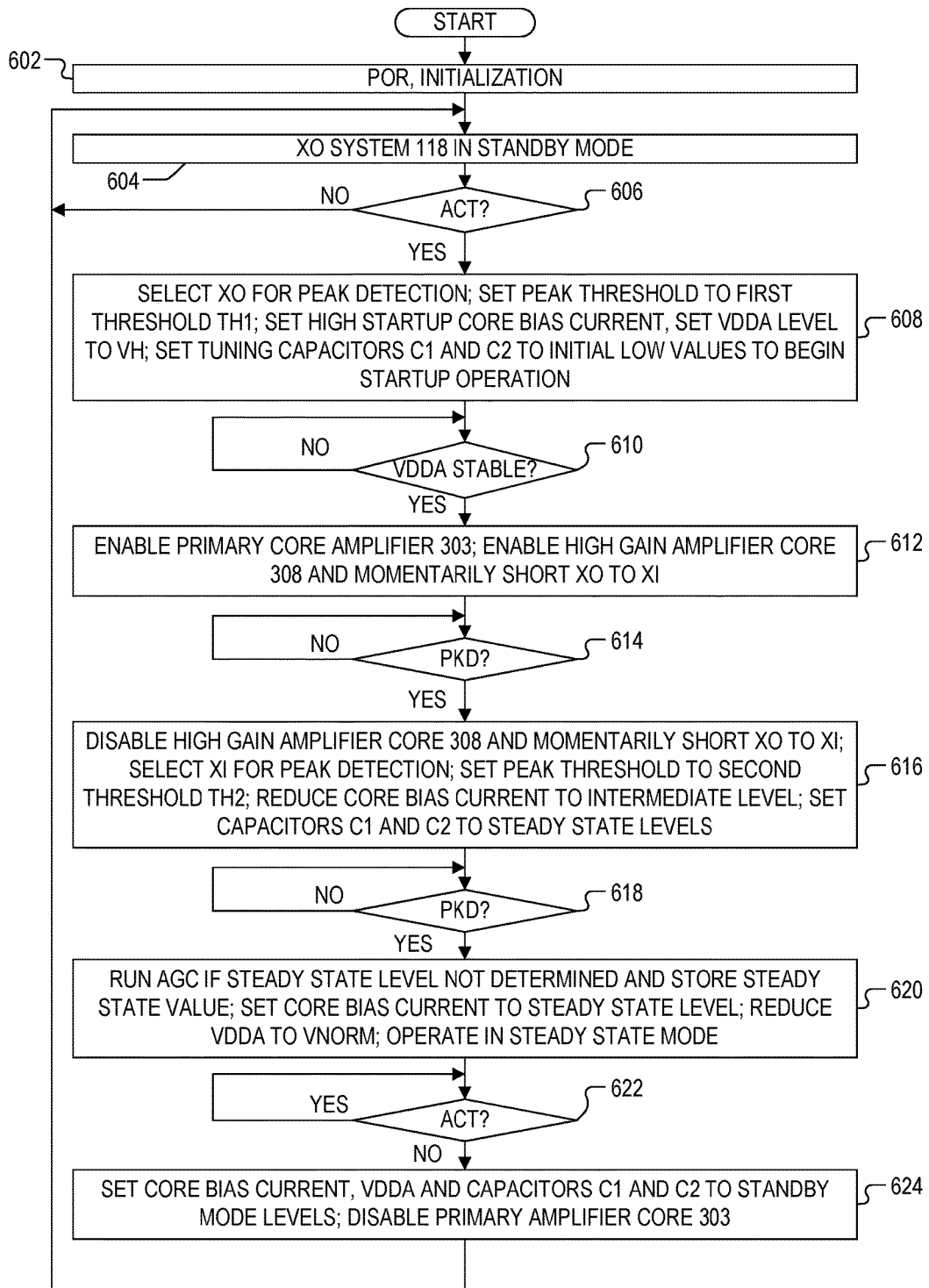
FIG. 6 is a flowchart diagram illustrating exemplary transitions of the XO system of FIG. 1 between the standby, startup, and steady state modes of operation according to one embodiment of the present invention.

FIG. 6 is a flowchart diagram illustrating exemplary transitions of the XO system 118 between the standby, startup, and steady state modes of operation according to one embodiment of the present invention. At a first block 602, the transceiver 100, including the XO system 118, is powered-on or otherwise reset (POR) and initialized. At next block 604, the XO system 118 is placed into its standby mode waiting for activation. At next query block 606, as long as ACT remains negated (or de-asserted), operation remains in the standby mode, represented as looping back to block 604. When ACT is asserted, operation transitions to block 608 in which the controller 216 begins the startup process. The XO pin (or the amplifier output node 204) is selected by the select circuit 212 for peak detection, such as asserting SEL high. The peak detector 305 selects the first predetermined threshold TH1 via PK_TH, and initial values are selected for the core bias current, the source voltage level VDDA, and the tuning capacitors C1 and C2. As previously described, the controller 216 asserts CBA to select a high startup core bias current level generated by the current source 304, asserts VADJ to set VDDA at an initial high source voltage level VH, and adjusts the tuning capacitors C1 and C2 to initial low capacitance values to accelerate the startup process.

When VDDA is stable as determined at next query block 610 (via sensing loop or time delay or the like), operation proceeds to block 612 in which the primary amplifier core 303 and the high gain amplifier core 308 are both enabled. For example, the controller 216 asserts CE and HGE high to enable both amplifier cores. Also, the controller 216 pulses SHRT high to "short" XO and XI together, meaning that the short resistor RS is momentarily placed in parallel with the bias resistor RB to substantially reduce the resistance between XO and XI. Once SHRT is negated, the negative resistance applied by the crystal amplifier 202 is the target high value since the high gain amplifier core 308 is enabled and the current source 304 applies the higher current level. Because of the high gain amplifier core 308, the current level needed by the current source 304 is substantially reduced to achieve the desired negative resistance compared to simply using the primary amplifier core 303 alone. As shown in FIG. 5, oscillation of the crystal 120 is initiated while peak detector 305 monitors XO.

When PKD is asserted by the peak detector 305 as determined at next query block 614, the voltage at XO has reached the first predetermined threshold TH1 and operation transitions to block 616 in which the high gain amplifier core 308 is disabled. For example, the controller 216 negates HGE low to disable the high gain amplifier core 308, and pulses SHRT high as previously described. Also, SEL is asserted low so that the select circuit 212 selects XI to be monitored by the peak detector 305. The peak detector 305 selects the second predetermined threshold TH2 via PK_TH, and the controller 216 adjusts CBA to reduce the core bias current to an intermediate level. Also, the capacitance of the capacitors C1 and C2 are adjusted via CP1 and CP2 to their steady state values.

When PKD is asserted by the peak detector 305 as determined at next query block 618, the voltage at XI has reached the second predetermined threshold TH2 and operation transitions to block 620 for steady state operation. If the steady state current level is not already known and/or the SS value is not stored in the memory 318, then the AGC process may be executed to identify the steady state current level, and the corresponding SS value is stored into the memory 318. The controller 216 adjusts CBA to set the core bias current to the steady state current level, and adjusts VADJ to reduce VDDA to VNORM. At this time, the crystal oscillator 203 oscillates at its steady state amplitude and the current communication session may be initiated and completed.

Operation remains in the steady state mode until negation of ACT as detected at next query block 622. When ACT is negated, operation transitions to block 624 in which the controller 216 begins the shutdown process to return the XO system 118 to the standby mode. The controller 216 adjusts CBA, VADJ, CP1 and CP2 to reduce the core bias current and the source voltage VDDA to minimal levels (e.g., 0), and to set the capacitors C1 and C2 to standby capacitance values. Operation then loops back to block 604 for standby mode operation of the XO system 118. Operation repeats in the same manner for subsequent activations.

Various modifications and/or simplifications of the circuit and/or the startup process are contemplated. A different method of enabling or disabling the high gain amplifier core 308 may be used. Also, disabling the high gain amplifier core 308 may be delayed until the steady state mode of operation. Also, multiple intermediate stages with multiple current levels during the startup process are contemplated, in which the high gain amplifier core 308 may be disabled at any time during the startup process. The cascode devices may be removed. The high gain amplifier core 308 may be operated with a different current source other than the current source 304 used for the primary amplfier core 303. The switch S1 may be eliminated (and replaced by a short) in which the primary amplifier core 303 remains enabled. RS and switch S2 may also be eliminated. Each of these changes reduces circuit size at the expense of reduced efficiency during operation. The regulator 302 may be fixed rather than adjustable so that VDDA remains fixed during operation. The capacitors C1 and C2 may also be fixed rather than being adjustable or may be provided as external devices. The select circuit 212 (and/or the MUX 301) may be eliminated in which only one of the amplifier nodes 206 (XI) or 204 (XO) is monitored. One or more threshold values may be adjusted accordingly. In embodiments in which XO may tend to saturate during startup, however, the select circuit 212 is advantageous by allowing XO to be monitored. In certain configurations the level detector 214 (and/or the peak detector 305) may be eliminated or at least not used for detecting oscillation. Instead, the timer 316 may be programmed to timeout during startup after a sufficient amount of time has elapsed (e.g., after being initiated by ACT) to ensure that oscillation is achieved. The time period may be empiracally determined.

Figure 7:
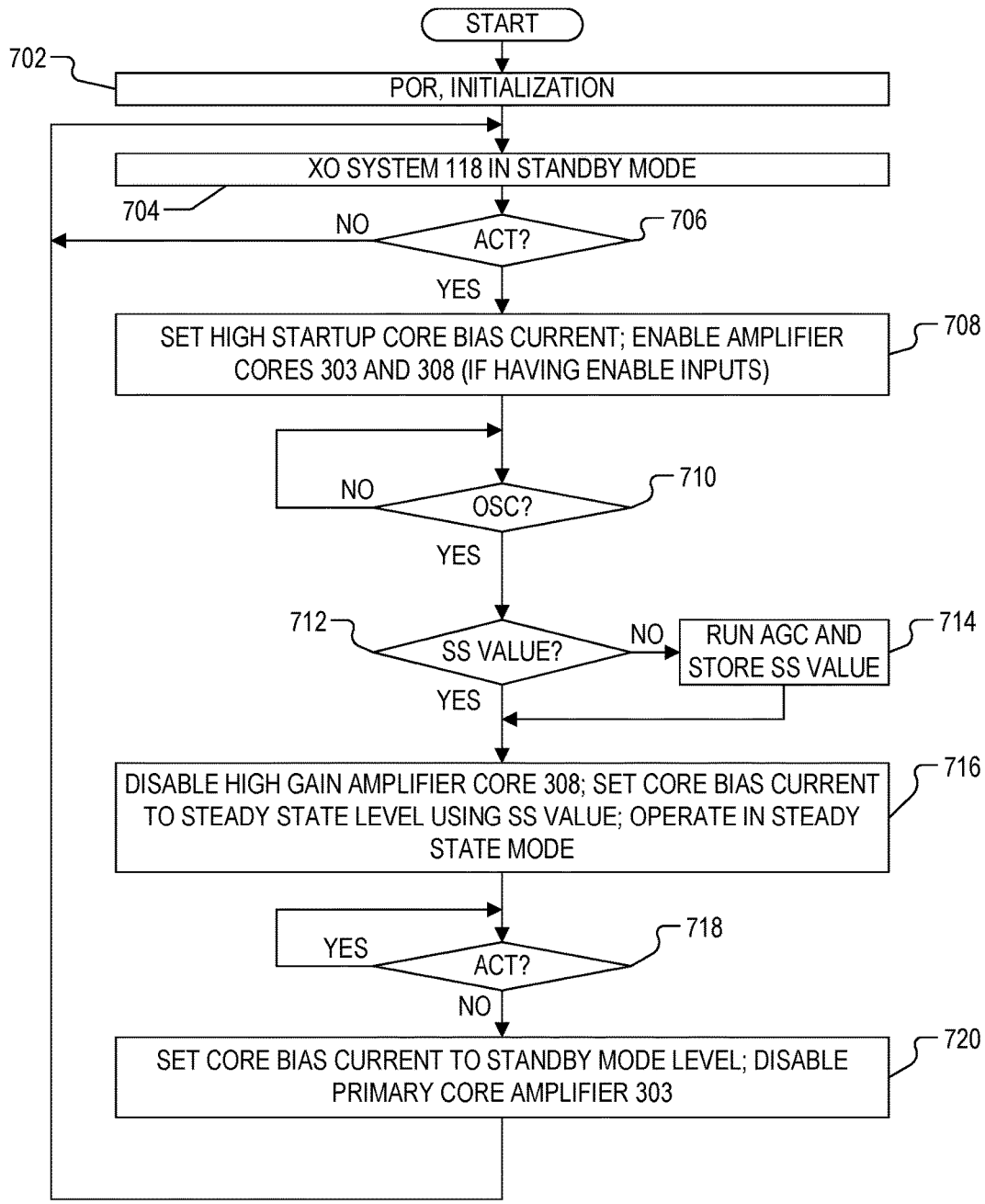
FIG. 7 is a flowchart diagram illustrating exemplary transitions of the XO system of FIG. 1 between the standby, startup, and steady state modes of operation according to alternative embodiments of the present invention.

FIG. 7 is a flowchart diagram illustrating exemplary transitions of the XO system 118 between the standby, startup, and steady state modes of operation according to alternative embodiments of the present invention. The first few blocks 702, 704 and 706 are the same as blocks 602, 604 and 606, respectively. At a first block 702, the transceiver 100, including the XO system 118, is powered-on or otherwise reset (POR) and initialized. At next block 704, the XO system 118 is placed into its standby mode waiting for activation. At next query block 706, as long as ACT remains negated (or de-asserted), operation remains in the standby mode, represented as looping back to block 704. When ACT is asserted, operation transitions to block 708 in which the controller 216 begins the startup process. At block 708, the controller 216 asserts CBA to select a high startup core bias current level generated by the current source 304. If not already enabled, the primary amplfier core 303 and/or the high gain amplifier core 308 may each be enabled. A short time delay may be inserted for VDDA to reach its normal voltage level. In the simplest configuration, the primary amplifer core 303 and/or the high gain amplifier core 308 remain coupled and are effectively disabled by zero core bias current standby.

At next block 710, the controller 218 determines whether oscillation has been achieved. If not, operation loops at block 710. Oscillation may be determined using the level detector 214 and/or the peak detector 305 as previously described. Alternatively, block 710 is implemented by timeout of the timer 316. When oscillation is achieved as determined at block 710, operation proceeds to block 712 in which it is queried whether the steady state value (SS value) is either known or stored in the memory 318 from a previous startup process. If not, operation proceeds to block 714 in which the AGC process is conducted to determine the steady state current level provided by the current source 304. Since the current was previously set high, the AGC process may include reducing the core bias current until LD or PKD is not provided, and then increased again until LD or PKD is asserted again to find the steady state value. Once determined, the SS value may be stored in the memory 318. For embodiments without the level detector 214 or the peak detector 305, the SS value is predetermined and may be stored permanently.

After the SS value is determined at block 714 or simply retrieved at block 712, operation proceeds to block 716 in which the controller 216 disables the high gain amplifier core 308 and asserts CBA to the SS value for steady state operation. Operation then loops at query block 718 while ACT remains asserted during the steady state operating mode. When ACT is negated, operation transitions to block 720 in which the core bias current is set to the standby level (e.g., zero). Also, the primary amplifier core 303 may be disabled. Operation then loops back to block 704 for the standby mode. Operation repeats in the same manner for subsequent activations.

FIG. 8 is a schematic diagram of an alternative primary amplifier core 803 that may replace the primary amplifier core 303. The primary amplifier core 803 is implemented according to an NMOS configuration in which P1 and CD are eliminated and the source node 306 is merged with the amplifier output node 204. The current source 304 is included to provide the core bias current in the same manner for both configurations. Operation is substantially similar.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A crystal amplifier for driving a crystal to oscillate at a resonant frequency, comprising:
a controlled current source having a control input, wherein said current source provides a core bias current to a source node;
an amplifier input node and an amplifier output node for coupling across the crystal;
a primary amplifier core coupled between said source node and a reference node, having an input coupled to said amplifier input node having an output coupled to said amplifier output node;
a high gain amplifier core coupled between said source node and said reference node, having an input coupled to said amplifier input node, having an output coupled to said amplifier output node, and having an enable input;
a level detector having at least one input coupled to at least one of said amplifier input node and said amplifier output node and having an output providing a level indication when a level threshold is achieved, and wherein said level detector initially selects a first threshold value at said startup time; and
a controller coupled to said current source and to said high gain amplifier core and having an input receiving said level value, wherein said controller sets said current source to a predetermined high current level and enables said high gain amplifier core to achieve a high negative resistance at a startup time, and wherein said controller determines that said oscillation is achieved when said level indication is provided and sets said current source to a lower steady state current level and disables said high gain amplifier core after oscillation is achieved;

wherein in response to said level indication indicating said first threshold value, said controller sets said current source to an intermediate current level that is less than said high current level and greater than said steady state current level, wherein after said level indication is first provided after said startup time, said level detector selects a second threshold value, and wherein in response to said level indication indicating said second threshold value, said controller sets said current source to said steady state current level.

2. The crystal amplifier of claim 1, wherein said controller switches said current source from said high current level to said steady state level after a programmable time period after said startup time.

3. The crystal amplifier of claim 1, wherein after said level indication is provided, said controller performs automatic gain control by adjusting a current provided by said current source to determine said steady state current level.

4. The crystal amplifier of claim 1, further comprising:
a select circuit having a first input coupled to said amplifier input node, a second input coupled to said amplifier output node, an output coupled to an input of said level detector, and a select input coupled to a second output of said controller; and
wherein said controller controls said select circuit to initially select said amplifier output node, and in response to said level indication indicating said first threshold value, said controller controls said select circuit to select said amplifier input node.

5. The crystal amplifier of claim 1, further comprising:
a first adjustable capacitor coupled between said amplifier output node and said reference node, and a second adjustable capacitor coupled between said amplifier input node and said reference node; and
wherein said controller sets a capacitance of said first and second adjustable capacitors to a predetermined low capacitance at said startup time, and wherein said controller sets said capacitance of said first and second adjustable capacitors to steady state values in response to said level indication indicating either said first threshold value or said second threshold value.

6. The crystal amplifier of claim 1, wherein said controller enables said high gain amplifier core after said startup time and disables said high gain amplifier core in response to said level indication indicating said first threshold value.

7. The crystal amplifier of claim 6, further comprising:
a shorting circuit coupled between said amplifier input node and said amplifier output node and having an enable input; and
wherein said controller momentarily enables said shorting circuit when said high gain amplifier core is enabled and again when said high gain amplifier core is disabled.

8. The crystal amplifier of claim 1, wherein said level detector comprises a peak detector.

9. A crystal amplifier for driving a crystal to oscillate at a resonant frequency, comprising:
a controlled current source having a control input, wherein said current source provides a core bias current to a source node;
an amplifier input node, an amplifier output node, and a reference node;
a primary amplifier core coupled between said source node and said reference node, having an input coupled to said amplifier input node and having an output coupled to said amplifier output node;
a high gain amplifier core coupled between said source node and said reference node, having an input coupled to said amplifier input node and having an output coupled to said amplifier output node, said high gain amplifier core comprising:
a first portion comprising a first cascode configuration of a first conductivity type having a current path coupled between said source node and said amplifier output node and having a control input coupled to said amplifier input node; and
a second portion comprising a second cascode configuration of a second conductivity type having a current path coupled between said amplifier output node and said reference node and having a control input coupled to said amplifier input node; and
a controller coupled to said controlled current source and to said high gain amplifier, wherein said controller sets said current source to a predetermined high current level and enables said high gain amplifier core after a startup time, and sets said current source to a lower steady state current level and disables said high gain amplifier core after oscillation is achieved.

10. The crystal amplifier of claim 9, further comprising a switch circuit for selectively disabling said high gain amplifier core by decoupling said control inputs of said first and second portions from said amplifier input node, by coupling said control input of said first portion to said source node, and by coupling said control input of said second portion to said reference node.

11. The crystal amplifier of claim 9, wherein:
said first portion comprises:
a first transistor of said first conductivity type having a first current terminal coupled to said source node, having a control terminal coupled to said amplifier input node, and having a second current terminal; and
a second transistor of said first conductivity type having a first current terminal coupled to said second current terminal of said first transistor of said first conductivity type, having a control terminal coupled to said amplifier input node, and having a second current terminal coupled to said amplifier output node; and
wherein said second portion comprises:
a first transistor of said second conductivity type having a first current terminal coupled to said amplifier output node; having a control terminal coupled to said amplifier input node, and having a second current terminal; and
a second transistor of said second conductivity type having a first current terminal coupled to said second current terminal of said first transistor of said second conductivity type, having a control terminal coupled to said amplifier input node, and having a second current terminal coupled to said reference node.

12. The crystal amplifier of claim 11, wherein said first transistor of said first conductivity type and said second transistor of said second conductivity type each comprise at least standard threshold voltage transistors, wherein said second transistor of said first conductivity type and said first transistor of said second conductivity type each comprise lower threshold voltage transistors, wherein said first transistor of said first conductivity type is at least twice as large as said second transistor of said first conductivity type, and wherein said second transistor of said second conductivity type is at least twice as large as said first transistor of said second conductivity type.

13. A method of driving a crystal to oscillate at a resonant frequency, comprising:
- at a startup time:
  - enabling a high gain amplifier core coupled in parallel with a primary amplifier core for driving the crystal coupled between an amplifier input and an amplifier output; and
  - asserting a core bias current provided to the primary amplifier core and to the high gain amplifier core at a high level;
- determining when oscillation is achieved;
- after said determining when oscillation is achieved, reducing the core bias current to an intermediate level that is less than the high level and greater than a steady state level;
- monitoring the voltage of the amplifier input; and
- reducing the core bias current to the steady state level when the voltage of the amplifier input reaches a threshold.

14. The method of claim 13, wherein said determining when oscillation is achieved comprises determining expiration of a predetermined time period after the startup time.

15. The method of claim 13, further comprising:
- monitoring the voltage of the amplifier output or the amplifier input; and
- wherein said determining when oscillation is achieved comprises determining when the monitored voltage reaches a threshold.

16. The method of claim 13, further comprising:
- at the startup time, adjusting capacitances at the amplifier input and the amplifier output to low values; and
- after said determining when oscillation is achieved, adjusting the capacitances at the amplifier input and the amplifier output to steady state values and momentarily reducing a bias resistance between the amplifier input and the amplifier output.

\* \* \* \* \*